(12) United States Patent
Xia et al.

(10) Patent No.: US 12,278,106 B2
(45) Date of Patent: Apr. 15, 2025

(54) PREPARATION METHOD OF SEMICONDUCTOR DEVICE

(71) Applicant: CHANGXIN MEMORY TECHNOLOGIES, INC., Hefei (CN)

(72) Inventors: Jun Xia, Hefei (CN); Shijie Bai, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 819 days.

(21) Appl. No.: 17/455,493

(22) Filed: Nov. 18, 2021

(65) Prior Publication Data
US 2022/0148878 A1   May 12, 2022

Related U.S. Application Data

(63) Continuation of application No. PCT/CN2021/095835, filed on May 25, 2021.

(30) Foreign Application Priority Data

Nov. 6, 2020 (CN) .......................... 202011229183.6

(51) Int. Cl.
*H01L 21/033* (2006.01)
*H01L 21/027* (2006.01)
*H01L 21/311* (2006.01)

(52) U.S. Cl.
CPC ...... *H01L 21/0332* (2013.01); *H01L 21/0274* (2013.01); *H01L 21/31144* (2013.01)

(58) Field of Classification Search
CPC ............. H01L 21/0332; H01L 21/0274; H01L 21/31144; H01L 21/0337
(Continued)

(56) References Cited

U.S. PATENT DOCUMENTS 10,606,176 B2   3/2020   Devilliers
2007/0148968 A1  6/2007   Kwon
(Continued)

FOREIGN PATENT DOCUMENTS

CN   105589299 A   5/2016
CN   107112212 A   8/2017
(Continued)

OTHER PUBLICATIONS

International Search Report in the international application No. PCT/CN2021/095835, mailed on Aug. 5, 2021, 5 pages.

*Primary Examiner* — Caleen O Sullivan
(74) *Attorney, Agent, or Firm* — Syncoda LLC; Feng Ma

(57) ABSTRACT

Provided is a preparation method of a semiconductor device, including the following steps: providing a substrate and forming a mask layer with a plurality of first windows on the substrate; forming a dielectric layer, the dielectric layer at least covering sidewalls of the first windows; forming a first photoresist material layer, the first photoresist material layer covering the dielectric layer and the mask layer and filling the first windows; patterning the first photoresist material layer to form a patterned first photoresist layer which exposes a top surface of the dielectric layer; by using the first photoresist layer and the mask layer as masks, removing the dielectric layer to form second windows; and removing part of the substrate along the second windows to form a patterned substrate.

19 Claims, 8 Drawing Sheets

(58) Field of Classification Search
USPC .......................................................... 438/703
See application file for complete search history.

(56) References Cited

U.S. PATENT DOCUMENTS

| | | |
|---|---|---|
| 2012/0282751 A1 | 11/2012 | Oh |
| 2013/0048605 A1 | 2/2013 | Sapre |
| 2016/0133477 A1 | 5/2016 | Trefonas, III et al. |
| 2016/0181100 A1 | 6/2016 | deVilliers et al. |
| 2020/0321245 A1* | 10/2020 | Li ...................... H01L 21/0337 |

FOREIGN PATENT DOCUMENTS

| | | |
|---|---|---|
| KR | 20100026732 A | 3/2010 |
| WO | 2011014020 A2 | 2/2011 |

* cited by examiner

PREPARATION METHOD OF SEMICONDUCTOR DEVICE

CROSS-REFERENCE TO RELATED APPLICATIONS

This application is a continuation application of International Patent Application No. PCT/CN2021/095835, filed on May 25, 2021, which claims priority to Chinese Application No. 202011229183.6, filed on Nov. 6, 2020. The disclosures of International Patent Application No. PCT/CN2021/095835 and Chinese Application No. 202011229183.6 are incorporated herein by reference in their entireties.

TECHNICAL FIELD

This application relates to the field of semiconductor production, and in particular to a preparation method of a semiconductor device.

BACKGROUND

In order to increase an integration density of semiconductor devices, many different methods have been adopted in the prior art, such as SADP (Self-aligned Double Patterning) process, SAQP (Self-aligned Quadruple Patterning) process and RSQP (Reverse Self-aligned Quadruple Patterning) process.

The specific process of the existing RSQP process is as follows.

Referring FIG. 1A, a substrate 100 is provided. The substrate 100 is provided with a patterned mask layer 110, and the mask layer 110 has openings 111 to expose the substrate 100.

Referring to FIG. 1B, a dielectric layer 120 is deposited on the mask layer 110, and the dielectric layer 120 covers an upper surface of the mask layer 110, sidewalls of the openings 111 and a surface of the substrate 100.

Referring to FIG. 1C, a spin-on hard mask layer (SOH) 130 is configured to cover the dielectric layer 120. The SOH layer 130 fills the openings 111, and an upper surface of the spin-on hard mask layer 130 is higher than the dielectric layer 120 and an upper surface of the mask layer 110.

Referring to FIG. 1D, part of the spin-coated hard mask layer 130 is removed by an etching process and a top surface of the dielectric layer 120 located on the sidewalls of the openings 111 and the dielectric layer 120 located on the upper surface of the mask layer 110 are exposed.

Referring to FIG. 1E, using the spin-coated hard mask layer 130 as a mask, the dielectric layer 120 and the corresponding substrate 100 are etched, and then a desired pattern 140 is formed in the substrate 100.

In the step of covering the dielectric layer 120 with the spin-coated hard mask layer 130, an ideal state of the spin-coated hard mask layer 130 formed is that the upper surface of the spin-coated hard mask layer 130 is kept flush, that is, the surface at all positions of the spin-coated hard mask layer 130 is in one plane. In an actual process, referring to FIG. 1C again, due to the different distribution density of the openings 111 of the mask layer 110, i.e., different aperture ratios at all positions of the mask layer 110, the spin-coated hard mask layer 130 has different heights, that is, the upper surface of the spin-coated hard mask layer 130 is not in the same plane. Specifically, the higher the distribution density of the openings 111 of the mask layer 110 (i.e., the lower the aperture ratio), the larger the height of the spin-coated hard mask layer 130. At edges of a semiconductor device, the distribution density of the openings 111 of the mask layer 110 is minimum (i.e., the aperture ratio is maximum). For example, the distribution density of the openings 111 of the mask layer 110 is high in some regions (such as Region A shown in FIG. 1C) (i.e., the aperture ratio is low), while in some regions (such as Region B shown in FIG. 1C), the distribution density of the openings 111 of the mask layer 110 is low (i.e., the aperture ratio is high), and the spin-coated hard mask layer 130 in Region A is higher than the spin-coated hard mask layer 130 in Region B. In this case, in the step of removing part of the spin-coated hard mask layer 130 by an etching process, as the etching progresses, low-height regions of the spin-coated hard mask layer 130 may expose the substrate 100; for example, at edges of a semiconductor device, the substrate 100 is most likely to be exposed. Etching gas will act on the substrate 100 and the substrate 100 is thus etched, resulting in damage to the substrate 100 and affecting the yield of semiconductor devices.

Therefore, a novel production method of a semiconductor device is desired to avoid the above-mentioned problems.

SUMMARY

The objective of this application is to provide a preparation method of a semiconductor device, which can avoid damage to a substrate and improve the yield of semiconductor devices.

In order to solve the above-mentioned problems, this application provides a preparation method of a semiconductor device, including the following steps: providing a substrate, wherein the substrate is provided with a mask layer, and a plurality of first windows are formed in the mask layer; forming a dielectric layer, wherein the dielectric layer at least covers sidewalls of the first windows; forming a first photoresist material layer, wherein the first photoresist material layer covers the dielectric layer and the mask layer and fills the first windows; patterning the first photoresist material layer to form a patterned first photoresist layer, wherein the first photoresist layer exposes a top surface of the dielectric layer; by using the first photoresist layer and the mask layer as masks, removing the dielectric layer to form second windows; and removing part of the substrate along the second windows to form a patterned substrate.

DESCRIPTION OF EMBODIMENTS

Specific embodiments of a preparation method of a semiconductor device provided in this application will be described in detail below in conjunction with the accompanying drawings.

Figure 2:
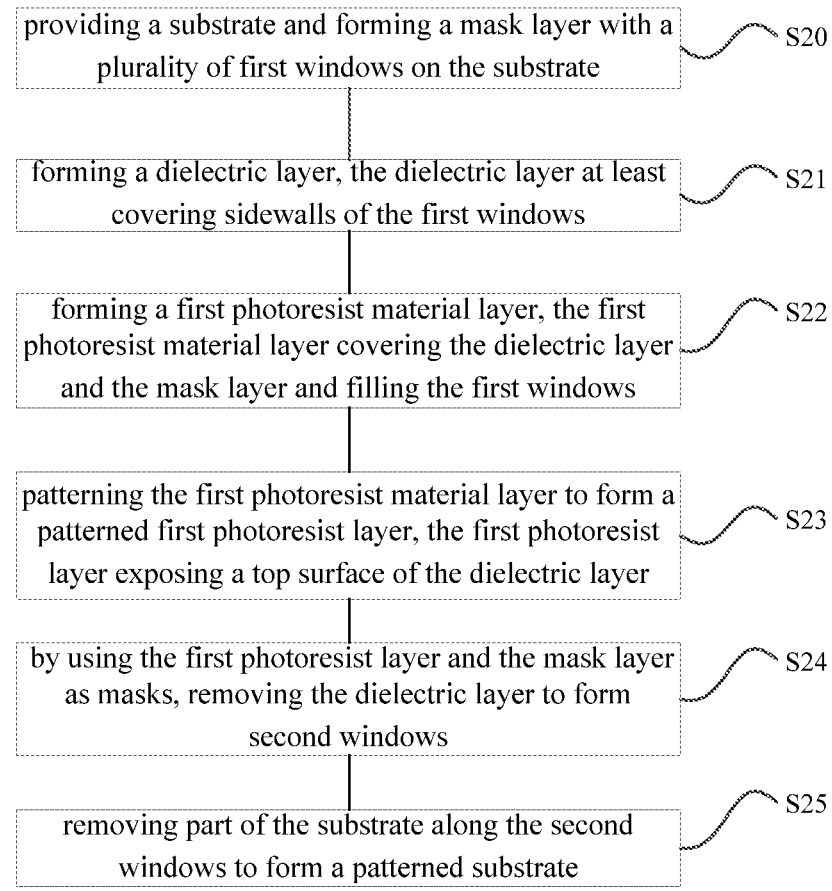
FIG. 2 is a schematic diagram of steps of a preparation method of a semiconductor device according to an embodiment of this application.

FIG. 2 is a schematic diagram of steps of a preparation method of a semiconductor device according to an embodiment of this application. Referring to FIG. 2, the preparation method of a semiconductor device in this application includes the following steps: step S20, providing a substrate and forming a mask layer with a plurality of first windows on the substrate; step S21, forming a dielectric layer, wherein the dielectric layer at least covers sidewalls of the first windows; step S22, forming a first photoresist material layer, wherein the first photoresist material layer covers the dielectric layer and the mask layer and fills the first windows; step S23, patterning the first photoresist material layer to form a patterned first photoresist layer, wherein the first photoresist layer exposes a top surface of the dielectric layer; step S24, by using the first photoresist layer and the mask layer as masks, removing the dielectric layer to form second windows; and step S25, removing part of the substrate along the second windows to form a patterned substrate.

FIGS. 3A-3H are process flowcharts of a preparation method of a semiconductor device according to an embodiment of this application.

Figure 3A:
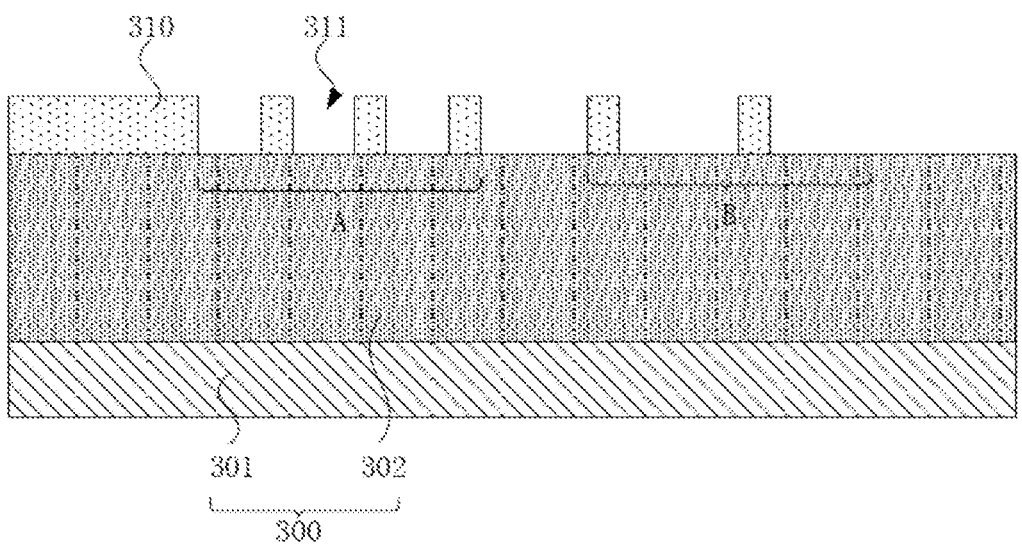
FIGS. 3A-3H are process flowcharts of a preparation method of a semiconductor device according to an embodiment of this application.

Referring to step S20 and FIG. 3A, a substrate 300 is provided, and a mask layer 310 with a plurality of first windows 311 is formed on the substrate 300.

The semiconductor substrate 300 may include a silicon substrate, a germanium (Ge) substrate, a silicon germanium (SiGe) substrate, an SOI substrate, a GOI (Germanium-On-Insulator) substrate, or the like; the semiconductor substrate 300 may also be a substrate including other elemental semiconductors or compound semiconductors, such as gallium arsenide, indium phosphide, or silicon carbide; the semiconductor substrate 300 may also be of a laminated structure, such as a silicon/germanium silicon laminated layer; in addition, the semiconductor substrate 300 may be a substrate subjected to ion doping, which may be P-type doping or N-type doping; a plurality of peripheral devices, such as field effect transistors, capacitors, inductors, and/or pn junction diodes, may also be formed in the semiconductor substrate 300. In this embodiment, the semiconductor substrate 300 includes a nitride layer 301 and an oxide layer 302 located above the nitride layer 301; the semiconductor substrate 300 further includes other substrate structures, such as a bit line structure and a transistor structure, disposed under the nitride layer 301, which are not shown because they has nothing to do with this application.

The mask layer 310 is disposed on an upper surface of the substrate 300, and the first windows 311 penetrate the mask layer 310 and expose the upper surface of the substrate 300. Specifically, in this embodiment, the first windows 311 penetrate the mask layer 310 and expose the upper surface of the oxide layer 302. The mask layer 310 may be of a single-layer structure or a multi-layer structure. For example, in this embodiment, the mask layer 310 is of a multi-layer structure composed of an SOH layer and a nitride layer. In other embodiments of this application, the mask layer 310 may only include a single nitride layer or SOH layer.

Further, in this embodiment, aperture ratios of the first windows in different regions of the mask layer 310 are different. The aperture ratio refers to a ratio of an area of the first windows 311 to an overall area of the mask layer 310. For example, in the mask layer 310, for Region A and Region B having the same area, in Region A, the aperture ratio of the first windows 311 is low, and in Region B, the aperture ratio of the first windows 311 is high. At edges of the semiconductor device, the aperture ratio of the first windows 311 is maximum. In other embodiments of this application, the aperture ratios of the first windows 311 in different regions of the mask layer 310 may also be the same, that is, in the mask layer 310, for Region A and Region B having the same area, their aperture ratios of the first windows 311 are the same.

Figure 4A:
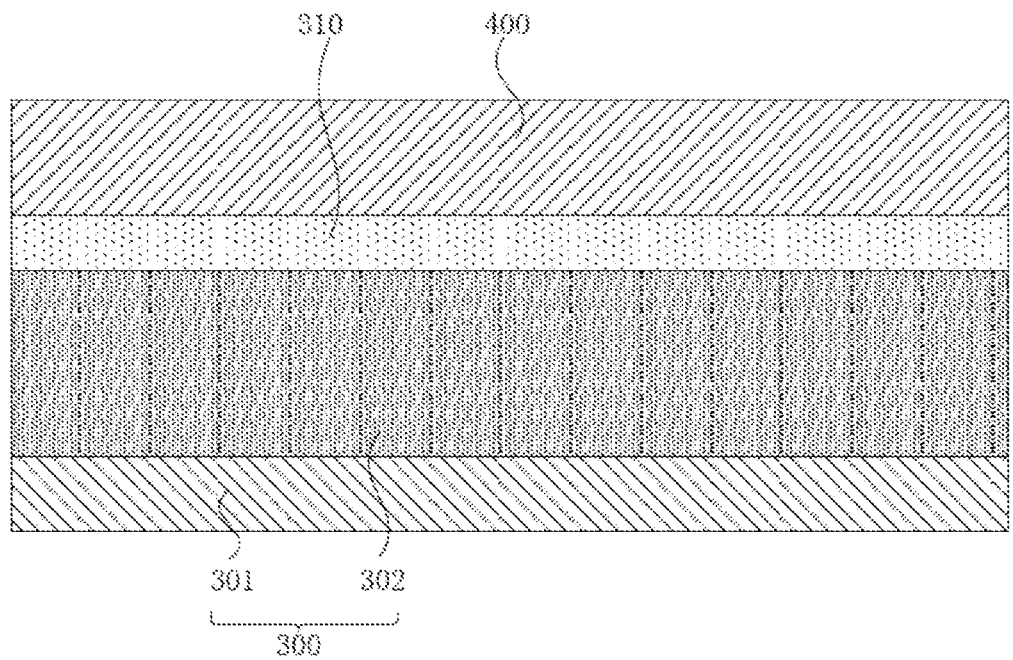
FIGS. 4A-4B are process flowcharts of forming a mask layer with a plurality of first windows on the substrate according to an embodiment of this application.

Further, this embodiment further provides a method for forming a mask layer 310 with a plurality of first windows 311 on the substrate 300. The method includes the following steps:

Referring to FIG. 4A, a mask layer 310 and a second photoresist material layer 400 are sequentially formed on the substrate 300. For example, the mask layer 310 is formed on the substrate 300 by a method such as chemical vapor deposition or physical vapor deposition, and the second photoresist material layer 400 is formed on the mask layer 310 by a spin coating process.

Figure 4B:
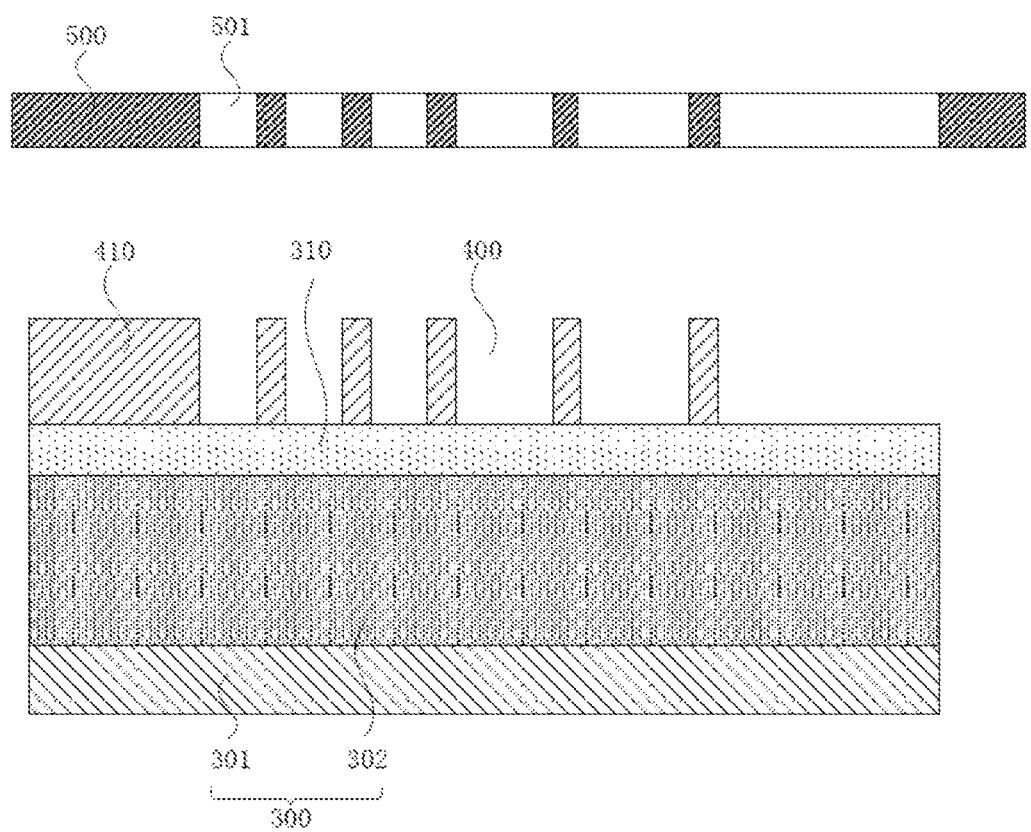

Referring to FIG. 4B, the second photoresist material layer 400 is patterned to form a patterned second photoresist layer 410.

In this step, a mask 500 can be used as a shield to expose and develop the second photoresist material layer 400 to form the second photoresist layer 410. The mask 500 has a plurality of openings 501 through which light reaches the second photoresist material layer 400. In this embodiment, the second photoresist material layer 400 is of a positive photoresist, a region irradiated by the light is removed, and a region not irradiated by the light is retained; that is, a region corresponding to the openings 501 is removed, and a region not corresponding to the openings 501 is retained. In other embodiments of this application, if the second photoresist material layer 400 is of a reflective photoresist, the region irradiated by the light is retained, and the region not irradiated by the light is removed; that is, the region corresponding to the openings 501 is retained, and the region not corresponding to the openings 501 is removed.

By using the second photoresist layer 410 as a mask, a pattern of the second photoresist layer 410 is transferred to the mask layer 310, and then a plurality of the first windows 311 are formed in the mask layer 310, and a structure formed in this step is as shown in FIG. 3A. In this step, by using the second photoresist layer 410 as a mask, the mask layer 310 is etched to form the plurality of first windows 311 in the mask layer 310.

Figure 3B:
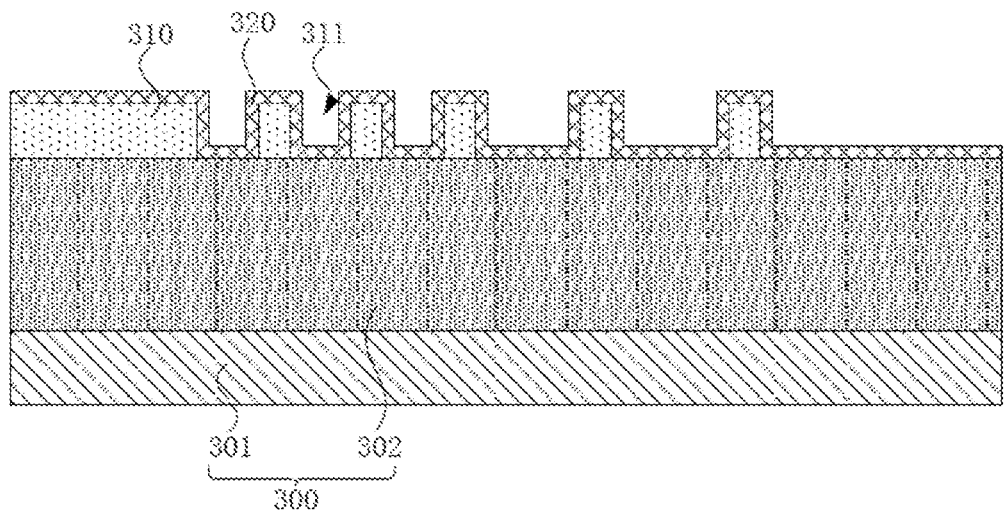

Referring to step S21 and FIG. 3B, a dielectric layer 320 is formed, and the dielectric layer 320 at least covers sidewalls of the first windows 311. In this embodiment, the dielectric layer 320 covers not only the sidewalls of the first windows 311, but also an upper surface of the mask layer 310 and an exposed surface of the substrate 300. In other embodiments of this application, the dielectric layer 320 may also only cover the sidewalls of the first windows 311.

In this embodiment, the dielectric layer 320 is an oxide layer, which is of the same material as the oxide layer 302 of the substrate 300. In other embodiments of this application, the dielectric layer 320 may also be a layer of other materials, and the dielectric layer 320 has a relatively high etch selectivity ratio with the mask layer 310, the first photoresist layer 340, and a second photoresist layer 410 formed subsequently.

Further, a thickness of the dielectric layer 320 covering the sidewalls of the first windows 311 is the same as a width of a pattern to be subsequently formed on the substrate 300. Therefore, the width of the pattern subsequently formed on the substrate 300 can be defined according to the thickness of the dielectric layer 320. The dielectric layer 320 may be formed by an atomic layer deposition method, so that critical dimensions of the dielectric layer 320 are controllable and the good uniformity of the formed dielectric layer 320 in each region is ensured, thereby ensuring a good opening uniformity of second windows 350 (see FIG. 3F) to be formed subsequently and further ensuring a good uniformity of a pattern subsequently formed in the substrate 300.

Figure 3C:
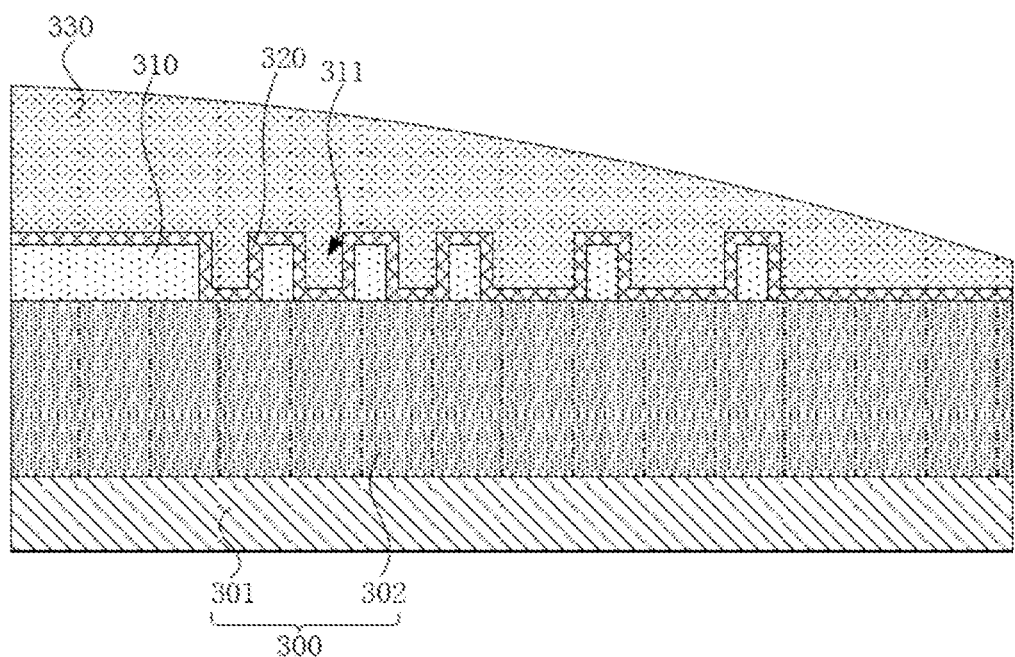

Referring to step S22 and FIG. 3C, a first photoresist material layer 330 is formed. The first photoresist material layer 330 covers the dielectric layer 320 and the mask layer 310 and fills the first windows 311. In this step, the first photoresist material layer 330 may be formed by a spin coating process. An upper surface of the first photoresist material layer 330 is higher than a top surface of the dielectric layer 320 and the upper surface of the mask layer 310 to further ensure that the surface of the substrate 300 is not exposed.

In step S22, an ideal state of the first photoresist material layer 330 is that the upper surface of the first photoresist material layer 330 is kept flush, that is, the surface at all positions of the first photoresist material layer 330 is in one plane. In an actual process, due to different aperture ratios of the first windows 311, the first photoresist material layer 330 has different heights. Specifically, the lower the aperture ratio of the first windows 311 is, the higher the height of the first photoresist material layer 330 is. For example, in this embodiment, at the edges of the semiconductor device, the aperture ratio of the first windows 311 is maximum, and the height of the first photoresist material layer 330 is minimum.

Figure 3D:
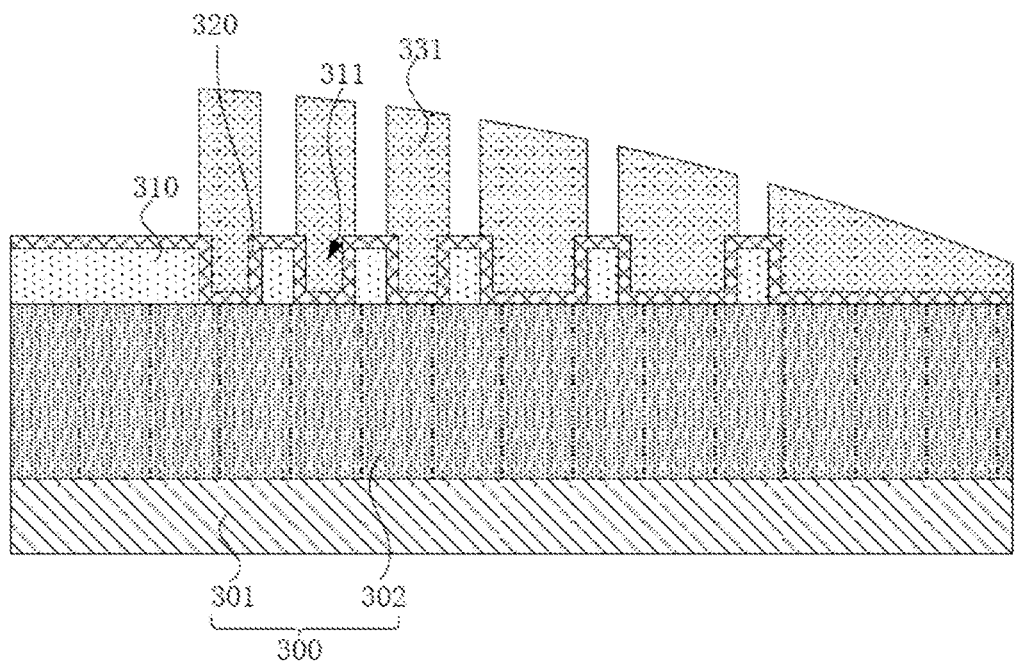
Figure 3E:
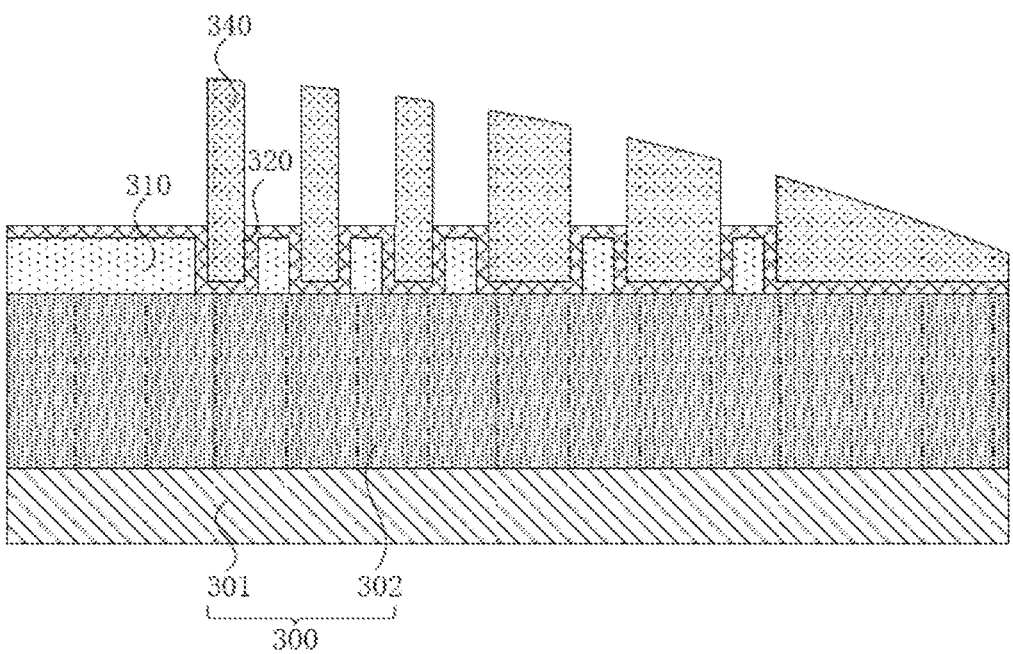

Referring to step S23, FIG. 3D and FIG. 3E, the first photoresist material layer 330 is patterned to form a patterned first photoresist layer 340, and the first photoresist layer 340 exposes the top surface of the dielectric layer 320.

Further, the first photoresist material layer 330 and the second photoresist material layer 400 are of different types. Specifically, if the first photoresist material layer 330 is of a positive photoresist, the second photoresist material layer 400 is of a negative photoresist; if the first photoresist material layer 330 is of a negative photoresist, the second photoresist material layer 400 is of a positive photoresist. In this step, the same mask as that used to form the second photoresist layer 410 can be used as a shield to expose and develop the first photoresist material layer 330 without a need to provide an additional mask, thereby simplifying the process and reducing the cost.

In this embodiment, the first photoresist material layer 330 is of a negative photoresist, and the second photoresist material layer 400 is of a positive photoresist. In this step, the same mask as that used to form the second photoresist layer 410 can be used as a shield to expose and develop the first photoresist material layer 330 to form the first photoresist layer 340. The first photoresist layer 340 only shields the first windows 311 and the dielectric layer 320 located on the sidewalls of the first windows 311. That is, in this step, the mask 500 is also used as a shield to expose and develop the first photoresist material layer 330. The region irradiated by the light is retained, and the region not irradiated by the light is removed; that is, the region corresponding to the openings 501 is retained, and the region not corresponding to the openings 501 is removed.

In other embodiments of this application, the first photoresist material layer 330 is of a positive photoresist, and the second photoresist material layer 400 is of a negative photoresist. In this step, the same mask as that used to form the second photoresist layer 410 can be used as a shield to expose and develop the first photoresist material layer 330 to form the first photoresist layer 340. The first photoresist layer 340 only shields the first windows 311 and the dielectric layer 320 located on the sidewalls of the first windows 311. That is, in this step, the mask 500 is also used as a shield to expose and develop the first photoresist material layer 330. The region irradiated by the light is removed, and the region not irradiated by the light is retained; that is, the region corresponding to the openings 501 is removed, and the region not corresponding to the openings 501 is retained.

Further, if the same mask as that used to form the second photoresist layer 410 is used as a shield to pattern the first photoresist material layer 330, since a size of the opening 501 of the mask 500 matches a size of the first window 311 and a size of the first photoresist layer 340 (i.e., the retained first photoresist material layer 330) is the same as the size of the first window 311, the dielectric layer 320 located on the sidewalls of the first windows 311 is covered by the first photoresist layer 340 and is not exposed, so that subsequent processes cannot be performed. Therefore, the step of patterning the first photoresist material layer 330 to form a patterned first photoresist layer 340 further includes the following steps.

Referring to FIG. 3D, the first photoresist material layer 330 is patterned to form a patterned primary photoresist layer 331. The primary photoresist layer 331 fills the first windows 311 and covers part of the top surface of the dielectric layer 320.

Referring to FIG. 3E, the primary photoresist layer 331 is corrected to form the first photoresist layer 340, and the first photoresist layer 340 exposes the top surface of the dielectric layer 320. After the primary photoresist layer 331 is corrected, the dielectric layer 320 to be removed is exposed so that the subsequent processes can proceed smoothly.

In this step, a method for correcting the primary photoresist layer 331 includes: ashing the primary photoresist layer 331 using oxygen plasma to expose the dielectric layer 320 to be removed.

Further, in other embodiments of this application, the first photoresist material layer 330 and the second photoresist material layer 400 are of the same type; for example, if the first photoresist material layer 330 and the second photoresist material layer 400 are both of a positive photoresist or are both of a negative photoresist, in the step of patterning the first photoresist material layer 330 and the second photoresist material layer 400, different masks can be used for shielding to obtain the first photoresist layer 340 and the second photoresist layer 410.

Figure 1A:
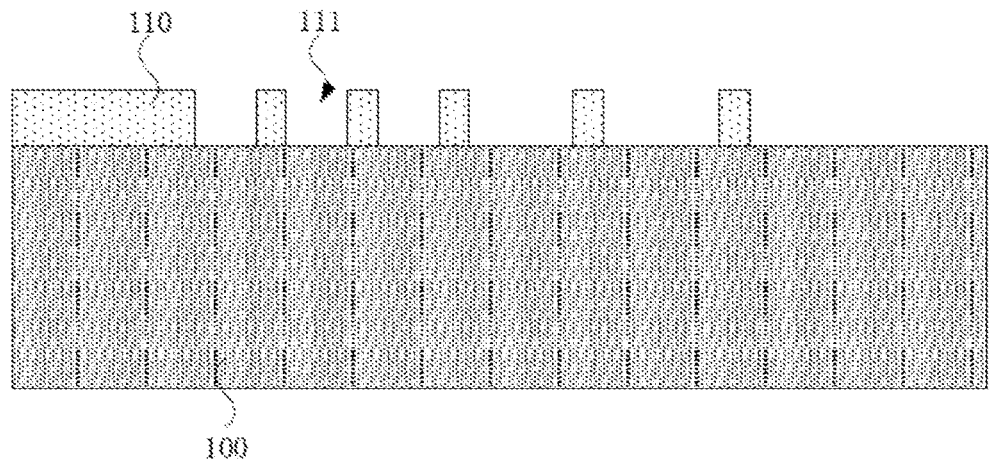
FIGS. 1A-1E are flowcharts of a reverse self-aligned quadruple patterning process in the prior art.
Figure 1B:
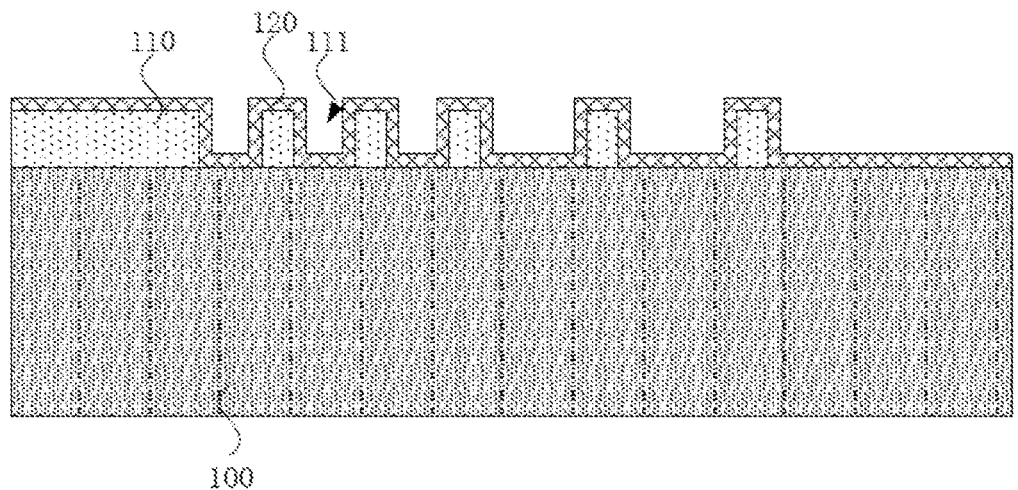
Figure 1C:
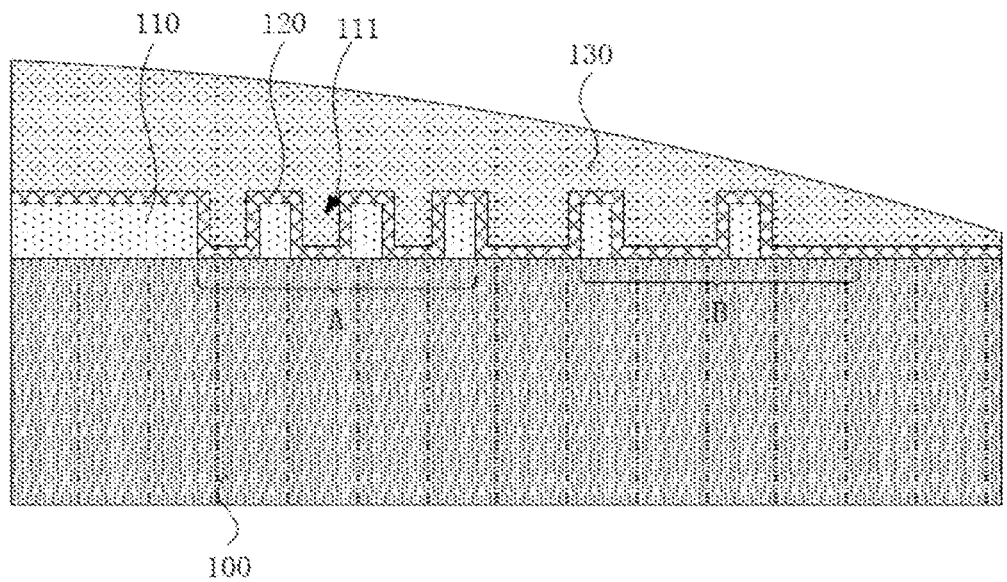
Figure 1D:
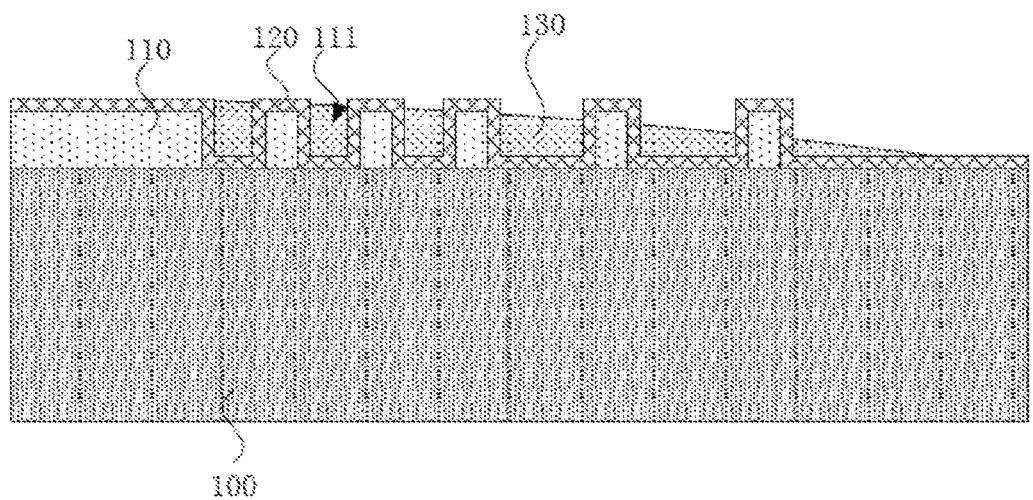
Figure 1E:
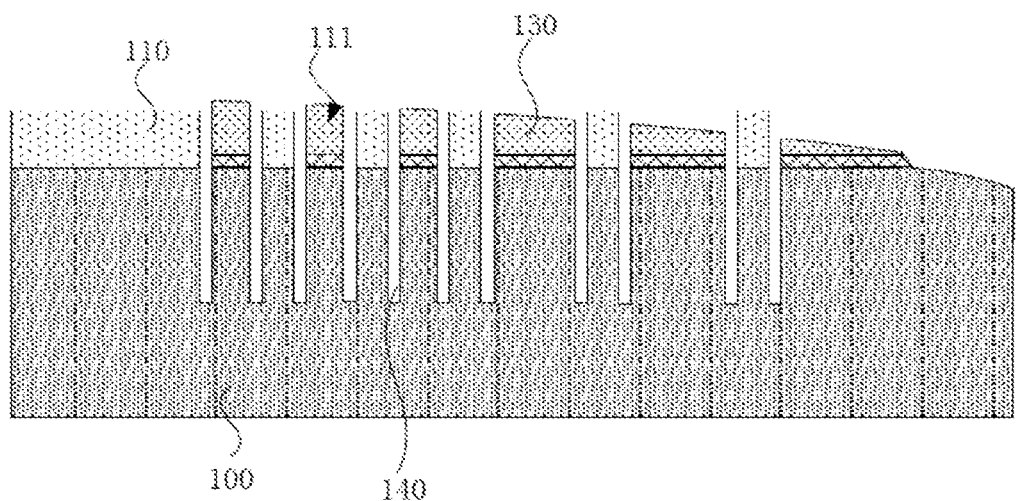

In step S23, in the process of patterning the first photoresist material layer 330, a height of a remaining part of the first photoresist material layer 330 is not changed; that is, in the process of patterning the first photoresist material layer 330, the case in the prior art (referring to FIG. 1D) that the substrate is exposed will not occur, thereby avoiding damage to the substrate in subsequent steps.

Figure 3F:
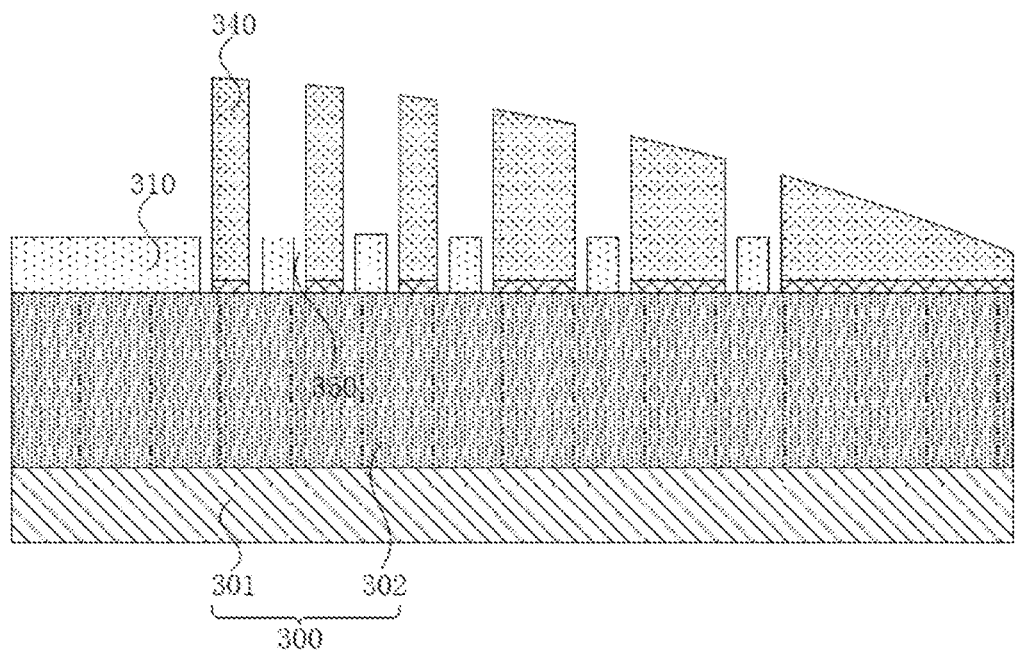

Referring to step S24 and FIG. 3F, by using the first photoresist layer 340 and the mask layer 310 as masks, the dielectric layer 320 is removed to form second windows 350.

In this embodiment, since the dielectric layer 320 covers not only the sidewalls of the first windows 311, but also the upper surface of the mask layer 310 and the exposed surface of the substrate 300, in this step, the dielectric layer 320 on the upper surface of the mask layer 310 is first removed, and then the mask layer 310 underneath is exposed. In a further etching process, the mask layer 310 and the first photoresist layer 340 are used as masks, and the dielectric layer 320 on the sidewalls of the first windows 311 is removed to form the second windows 350. It should be understood that, in this step, the dielectric layer 320 on the surface of the substrate 300 is retained because the dielectric layer 320 is shield by the first photoresist layer 340. In this embodiment, a dry etching process is carried out to etch the dielectric layer 320 to remove the dielectric layer 320 from the sidewalls of the first windows 311. An etching rate of an etching gas for the dielectric layer 320 is greater than that for the first photoresist layer 340 and for the mask layer 310, so as to avoid the case that the first photoresist layer 340 and the mask layer 310 are removed during the removal of the dielectric layer 320.

A width of the second window 350 is substantially the same as the thickness of the dielectric layer 320, that is, the width of the second window 350 depends on the thickness of the dielectric layer 320; therefore, a more uniform critical dimension of the dielectric layer 320 causes a more uniform width of the second window 350 formed, thereby ensuring that a critical dimension of a pattern subsequently formed on the substrate is more uniform.

Figure 3G:
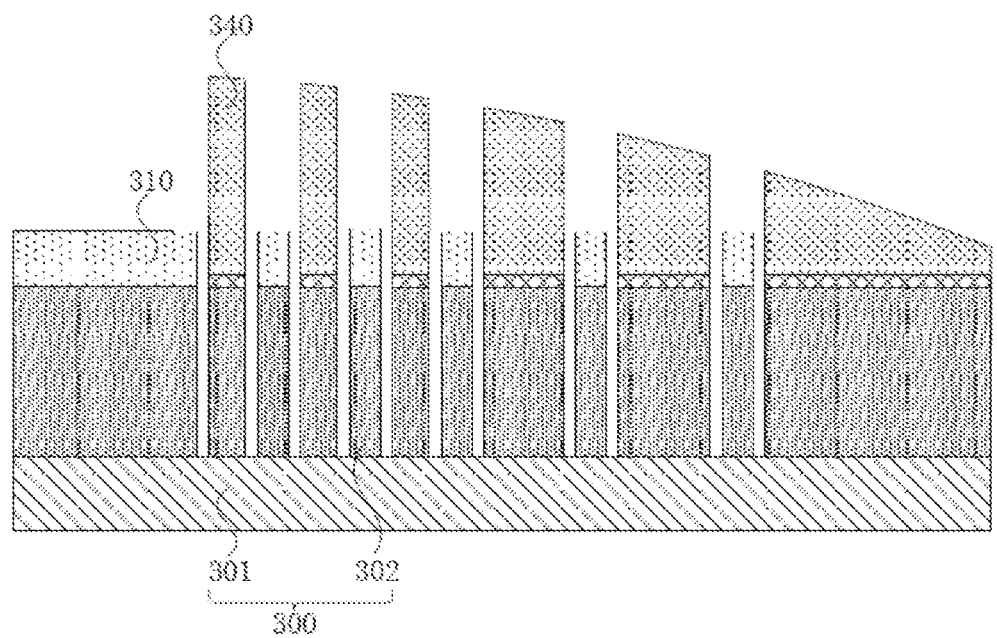

Referring to step S25 and FIG. 3G, part of the substrate 300 is removed along the second windows 350 to form a patterned substrate.

In this embodiment, by using the first photoresist layer 340 and the mask layer 310 as masks, the oxide layer 302 is etched along the second windows 350 so that part of the oxide layer 302 is removed to form a patterned substrate. The etching method may be dry etching or wet etching. In this embodiment, dry etching is adopted.

In step S25, since the surface of the substrate 300 is shielded by the mask layer 310, the dielectric layer 320, and the first photoresist layer 340 located above the dielectric layer 320 and there is no exposed part on the substrate 300, the substrate 300 is not damaged during the etching process, which greatly improves the performance of the semiconductor device.

Figure 3H:
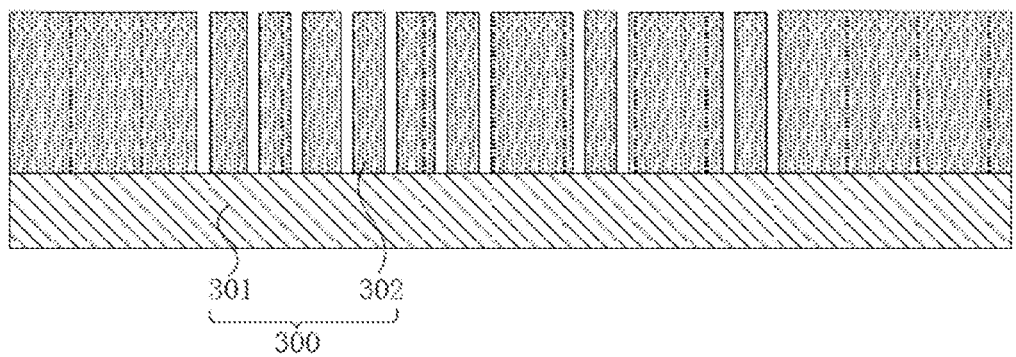

Further, referring to FIG. 3H, after step S25, the mask layer 310, the first photoresist layer 340, and the dielectric layer 320 covered by the first photoresist layer 340 are removed from the surface of the substrate 300 to form a patterned substrate.

According to the preparation method of a semiconductor device in this application, based on the material properties of the first photoresist material layer, the first photoresist material layer serves as a transition structure, so that during the patterning process of the first photoresist material layer, a part of the first photoresist material layer which needs to be retained is not damaged, and a part of the substrate which does not need to be etched is not exposed, and further the part of the substrate which does not need to be etched is not damaged in the subsequent process of forming the patterned substrate, thus greatly improving the yield of semiconductor devices.

The above are only the preferred embodiments of this application. It should be noted that for those of ordinary skill in the art, without departing from the principle of this application, several improvements and modifications can be made, and these improvements and modifications also should be considered as falling within the protection scope of this application.

What is claimed is:

1. A preparation method of a semiconductor device, comprising the following steps: providing a substrate and forming a mask layer with a plurality of first windows on the substrate; forming a dielectric layer, the dielectric layer at least covering sidewalls of the first windows; forming a first photoresist material layer, the first photoresist material layer covering the dielectric layer and the mask layer and filling the first windows; patterning the first photoresist material layer to form a patterned first photoresist layer, the patterned first photoresist layer exposing a top surface of the dielectric layer; by using the patterned first photoresist layer and the mask layer as masks, removing the dielectric layer to form second windows; removing part of the substrate along the second windows to form a patterned substrate; and after the step of removing part of the substrate along the second windows to form a patterned substrate, removing the mask layer and the patterned first photoresist layer from a surface of the substrate.

2. The preparation method of a semiconductor device according to claim 1, wherein the step of forming a mask layer with a plurality of first windows comprises the following steps:
sequentially forming a mask layer and a second photoresist material layer on the substrate;
patterning the second photoresist material layer to form a patterned second photoresist layer; and
by using the patterned second photoresist layer as a mask, transferring a pattern of the patterned second photoresist layer to the mask layer to form a mask layer with a plurality of windows.

3. The preparation method of a semiconductor device according to claim 2, wherein the first photoresist material layer and the second photoresist material layer are of different types.

4. The preparation method of a semiconductor device according to claim 3, wherein the first photoresist material layer is of a positive photoresist, and the second photoresist material layer is of a negative photoresist; or, the first photoresist material layer is of a negative photoresist, and the second photoresist material layer is of a positive photoresist.

5. The preparation method of a semiconductor device according to claim 3, wherein the step of patterning the first photoresist material layer and the step of patterning the second photoresist material layer are carried out using the same mask.

6. The preparation method of a semiconductor device according to claim 5, wherein the step of patterning the first photoresist material layer to form a patterned first photoresist layer further comprises:
patterning the first photoresist material layer to form a patterned primary photoresist layer, the patterned primary photoresist layer filling the first windows and covering part of a top surface of the dielectric layer; and
correcting the patterned primary photoresist layer to form the patterned first photoresist layer, the patterned first photoresist layer exposing the top surface of the dielectric layer.

7. The preparation method of a semiconductor device according to claim 5, wherein the step of patterning the second photoresist material layer to form a patterned second photoresist layer further comprises:
by using the mask as a shield, exposing and developing the second photoresist material layer to form the patterned second photoresist layer,
the mask has a plurality of openings through which light reaches the second photoresist material layer.

8. The preparation method of a semiconductor device according to claim 6, wherein a method for correcting the patterned primary photoresist layer further comprises:
ashing the patterned primary photoresist layer using oxygen plasma to expose the dielectric layer to be removed.

9. The preparation method of a semiconductor device according to claim 2, wherein the first photoresist material layer and the second photoresist material layer are of the same type.

10. The preparation method of a semiconductor device according to claim 9, wherein the first photoresist material layer and the second photoresist material layer are both of a positive photoresist or are both of a negative photoresist.

11. The preparation method of a semiconductor device according to claim 1, wherein an upper surface of the first photoresist material layer is higher than the top surface of the dielectric layer and an upper surface of the mask layer.

12. The preparation method of a semiconductor device according to claim 1, wherein in the step of removing the dielectric layer by using the patterned first photoresist layer and the mask layer as masks, an etching process is carried out to remove the dielectric layer, and an etching rate of an etching agent for the dielectric layer is greater than an etching rate for the patterned first photoresist layer and the mask layer.

13. The preparation method of a semiconductor device according to claim 1, wherein aperture ratios of the first windows are different in different regions of the mask layer.

14. The preparation method of a semiconductor device according to claim 1, wherein an atomic layer deposition method is carried out to form the dielectric layer.

15. The preparation method of a semiconductor device according to claim 1, wherein the substrate is composed of different element semiconductors or different compound semiconductors which are laminated.

16. The preparation method of a semiconductor device according to claim 1, wherein the dielectric layer covers not only the sidewalls of the first windows, but also an upper surface of the mask layer and an exposed surface of the substrate.

17. The preparation method of a semiconductor device according to claim 1, wherein the dielectric layer is made of the same material layer as an oxide layer of the substrate.

18. The preparation method of a semiconductor device according to claim 15, wherein the removing part of the substrate along the second windows to form a patterned substrate further comprises:
by using the patterned first photoresist layer and the mask layer as masks, etching the oxide layer along the second windows to remove part of the oxide layer to form a patterned substrate.

19. The preparation method of a semiconductor device according to claim 1, wherein a thickness of the dielectric layer covering the sidewalls of the first windows is the same as a width of a pattern formed on the substrate.

* * * * *